United States Patent
Nishimori (10) Patent No.: US 7,342,443 B2
(45) Date of Patent: Mar. 11, 2008

(54) OPERATIONAL AMPLIFIER

(75) Inventor: Eiji Nishimori, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 79 days.

(21) Appl. No.: 11/450,347

(22) Filed: Jun. 12, 2006

(65) Prior Publication Data

US 2007/0188223 A1  Aug. 16, 2007

(30) Foreign Application Priority Data

Feb. 16, 2006 (JP) .............................. 2006-039290

(51) Int. Cl.
*H03F 1/14* (2006.01)

(52) U.S. Cl. ........................... 330/51; 330/9; 330/302; 330/67

(58) Field of Classification Search .................. 330/51, 330/9, 302, 67
See application file for complete search history.

(56) References Cited

U.S. PATENT DOCUMENTS 3,988,689 A * 10/1976 Ochi et al. ...................... 330/9
5,396,439 A * 3/1995 Yamada ..................... 73/514.33
5,703,353 A * 12/1997 Blalock et al. ............ 250/214 C
5,757,219 A * 5/1998 Weedon et al. .............. 327/307
5,796,300 A * 8/1998 Morgan ............................ 330/9
6,507,241 B1 * 1/2003 Ritter .............................. 330/9
6,529,015 B2 * 3/2003 Nonoyama et al. .......... 324/678

FOREIGN PATENT DOCUMENTS

JP        08-018353 A     1/1996
JP     2001-292041 A    10/2001

* cited by examiner

*Primary Examiner*—Patricia Nguyen
(74) *Attorney, Agent, or Firm*—Arent Fox LLP (57) ABSTRACT

An operational amplifier for canceling an offset and continuously generating an output signal. The operational amplifier includes a first operational amplification unit and a second operational amplification unit each having at least one electrical characteristic that is substantially the same as one another. One of the operational amplification units performs a canceling operation (holding operation and compensation operation) of the offset voltage while the other operational amplification unit performs a non-canceling operation and generates the output voltage by amplifying an input voltage. Both operational amplification units alternately perform the canceling operation and the non-canceling operation.

11 Claims, 5 Drawing Sheets

OPERATIONAL AMPLIFIER

CROSS-REFERENCE TO RELATED APPLICATIONS

This application is based upon and claims the benefit of priority from the prior Japanese Patent Application No. 2006-039290, filed on Feb. 16, 2006, the entire contents of which are incorporated herein by reference.

BACKGROUND OF THE INVENTION

The present invention relates to an operational amplifier, and more particularly, to an operational amplifier for canceling an offset from an output signal.

In recent years, an LSI incorporates a large number of operational amplifiers. An operational amplifier is a basic circuit mounted on an LSI. However, the output signal of the operational amplifier contains errors caused by characteristic variations in the transistors configuring the operational amplifier. Therefore, errors must be cancelled from the output signal through a simple method. Further, an output signal of the operational amplifier is used to monitor the output signal at any given point of time. Thus, an operational amplifier is required to continuously generate an output signal.

Figure 1:
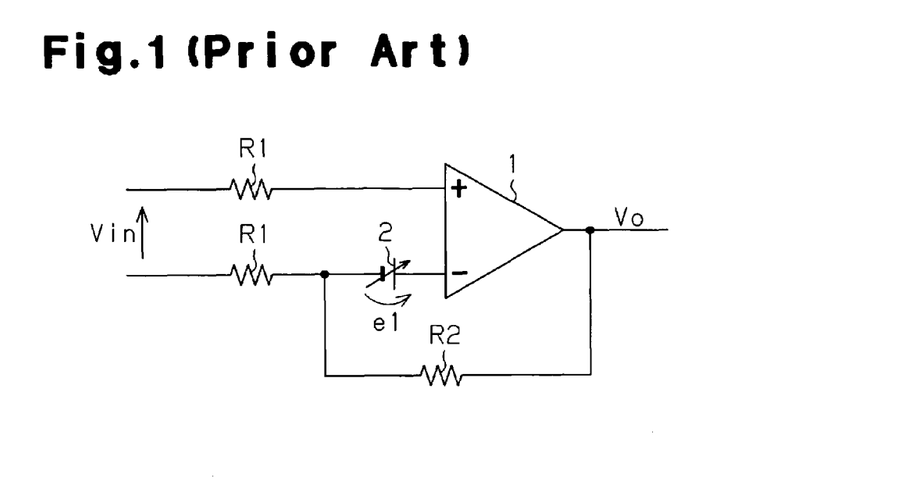
FIG. 1 is a schematic equivalent circuit diagram of an operational amplifier in the prior art.

In the prior art, many operational amplifiers are used to amplify analog signals or amplify differential signals. However, since the output signal of an operational amplifier contains errors, the output signal is not 0 V even if an input signal is 0 V. Such an error in the output signal with respect to the input signal is referred to as an offset voltage. In FIG. 1, the offset voltage is represented by a voltage source 2, which is connected to an input terminal of the operational amplifier 1.

The output voltage Vo of the operational amplifier 1, which is determined by an input voltage Vin, an input resistance R1, and a feedback resistance R2, is obtained from the equation shown below.

$$Vo=(1+R2/R2)\times Vin$$

However, the offset voltage e1, which corresponds to the voltage source 2 shown in FIG. 1, is actually superimposed on the input voltage Vin. The output voltage Vo is thus obtained from the equation shown below using the offset voltage e1.

$$Vo=(1+R2/R2)\times(Vin-e1)$$

In other words, the offset voltage e1 is amplified together with the input voltage Vin. The offset voltage e1 contained in the output voltage Vo is thus large when the input voltage Vin is small.

To cancel the offset voltage of the operational amplifier, the area of the elements configuring the operational amplifier may be increased. When the element area is increased by two times, this method generally reduces the output error (offset) to the square root of ½. However, elements with large areas are needed to minimize the offset. This increases costs.

A method proposed to cancel the offset voltage of the operational amplifier without having to increase element area includes short-circuiting the two input terminals of the operational amplifier, holding the output voltage of the operational amplifier as the offset voltage, and feeding back the held voltage to the operational amplifier.

For example, Japanese Laid-Open Patent Publication No. 8-18353 discloses an operational amplifier including a main amplifier, an auxiliary amplifier, and a holding means. The auxiliary amplifier receives the output signal of the main amplifier and operationally amplifies the output signal in a reverse direction of the main amplifier. The holding means holds the output signal of the auxiliary amplifier and feeds back the held voltage to the main amplifier. The operational amplifier reduces the offset error of the main amplifier to an inverse of the gain of the main amplifier.

Japanese Laid-Open Patent Publication No. 2001-292041 discloses another example of an operational amplifier. The operational amplifier accumulates voltage, which is amplified by an operational amplification circuit and contains an offset, in a capacitor. The voltage value of the operational amplifier is feedback controlled based on the accumulated voltage.

SUMMARY OF THE INVENTION

The output signal of the operational amplifier is an analog signal. An analog signal is normally used to monitor the analog signal at a given point of time. The operational amplifier is thus required to continuously generate the output signal. However, the operational amplifier disclosed in each of the above publications cancel the offset by holding or accumulating the offset voltage and feeding back the held or accumulated offset voltage to the operational amplifier. That is, the operation of holding or accumulating the offset voltage and the operation of canceling the offset are alternately repeated. The output signal thus becomes non-continuous with respect to the input signal. Such an output signal cannot be used for the above application.

The present invention provides an operational amplifier for canceling the offset of the output signal while maintaining continuity of the output signal.

One aspect of the present invention is an operational amplifier for generating an output voltage by amplifying an input voltage. The operational amplifier includes a first capacitor. A first operational amplification unit connected to the first capacitor has a first offset voltage. The first operational amplification unit accumulates charge corresponding to the first offset voltage in the first capacitor and alternately performs a canceling operation, for canceling the first offset voltage with the charge accumulated in the first capacitor, and a non-canceling operation, for generating a first output voltage by amplifying the input voltage. The operational amplifier further includes a second capacitor. A second operational amplification unit connected to the second capacitor has substantially the same electrical characteristic as the first operational amplification unit. The second operational amplification unit also has a second offset voltage. The second operational amplification unit accumulates charge corresponding to the second offset voltage in the second capacitor and alternately performs a canceling operation, for canceling the second offset voltage with the charge accumulated in the second capacitor, and a non-canceling operation, for generating a second output voltage by amplifying the input voltage. An output selection circuit, connected to the first and second operational amplification units, alternately selects the first output voltage and the second output voltage as the output voltage of the operational amplifier. The second operational amplification unit performs the non-canceling operation when the first operational amplification unit is performing the canceling operation, and the second operational amplification unit performs the canceling operation when the first operational amplification unit is performing the non-canceling operation.

Other aspects and advantages of the present invention will become apparent from the following description, taken in conjunction with the accompanying drawings, illustrating via example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

The operational amplifier 10 according to a first embodiment of the present invention will now be described with reference to the drawings.

Figure 2:
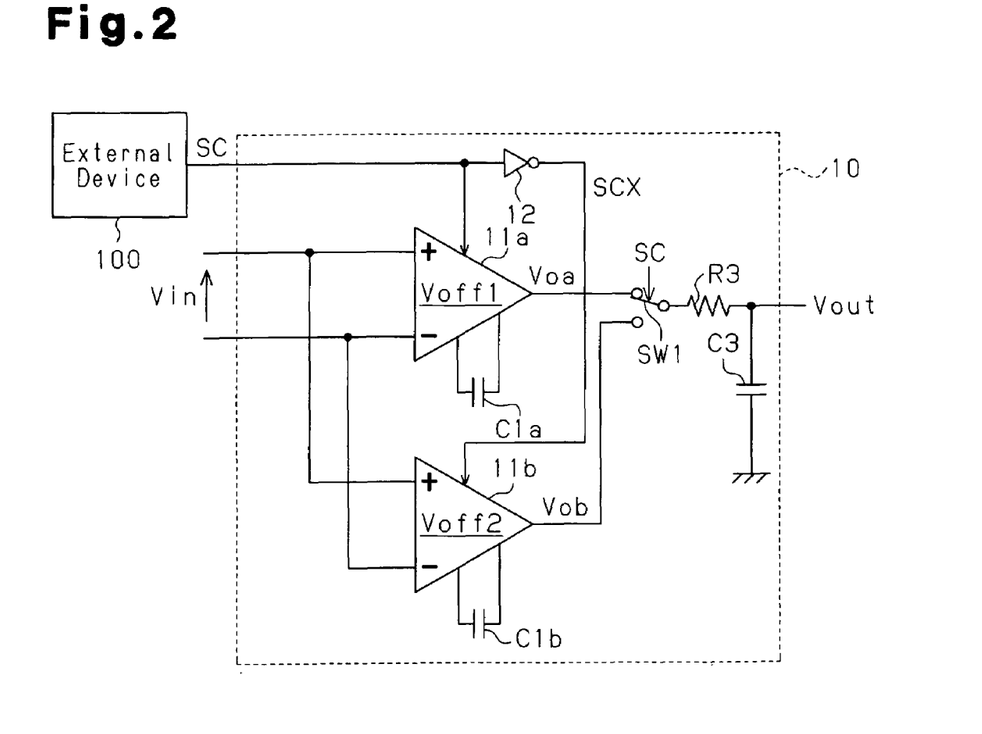
FIG. 2 is a schematic circuit diagram of an operational amplifier according to a first embodiment of the present invention.

As shown in FIG. 2, the operational amplifier 10 includes a first operational amplification unit 11a and a second operational amplification unit 11b. The first operational amplification unit 11a and the second operational amplification unit 11b have substantially the same electrical characteristic, and each of the operational amplification units 11a and 11b receives the same input voltage Vin. Specifically, a non-inverting input terminal of the first operational amplification unit 11a is connected to a non-inverting input terminal of the second operational amplification unit 11b, and an inverting input terminal of the first operational amplification unit 11a is connected to an inverting input terminal of the second operational amplification unit 11b. The input voltage Vin is supplied to the inverting input terminals and the non-inverting input terminals of the two operational amplification units 11a, 11b. The first operational amplification unit 11a and the second operational amplification unit 11b amplify the input voltage Vin and respectively generate output voltages Voa and Vob.

First and second capacitors C1a and C1b, which cancel offsets, are respectively connected to the first operational amplification unit 11a and the second operational amplification unit 11b. The first operational amplification unit 11a accumulates charge, which corresponds to its offset voltage Voff1 (first offset voltage), in the capacitor C1a and cancels the offset of the output voltage Voa with the charge accumulated in the capacitor C1a. Similarly, the second operational amplification unit 11b accumulates charge, which corresponds to its own offset voltage Voff2 (second offset voltage), in the capacitor C1b and cancels the offset of the output voltage Vob with the charge accumulated in the capacitor C1b. That is, the first operational amplification unit 11a and the second operational amplification unit 11b respectively perform holding operations for holding the offset voltages Voff1 and Voff2 in the capacitors C1a and C1b. Then, the first operational amplification unit 11a and the second operational amplification unit 11b respectively perform compensation operations for generating the output voltages Voa and Vob by canceling the offset with the offset voltages Voff1 and Voff2 held in the capacitors C1a and C1b.

A control signal SC is provided to the first operational amplification unit 11a from an external device 100. An inverted control signal SCX, which is generated by inverting the control signal SC with an inverter circuit 12, is provided to the second operational amplification unit 11b. The first operational amplification unit 11a performs a canceling operation, which includes the holding operation and the compensation operation, when the control signal SC has a first level (e.g., an L level). Further, the first operational amplification unit 11a performs a non-canceling operation to generate the output voltage Voa (output voltage Vout of the operational amplifier 10) when the control signal SC has a second level (e.g., an H level). Similarly, the second operational amplification unit 11b performs a canceling operation, which includes the holding operation and the compensation operation, when the inverted control signal SCX has a first level (e.g., an L level). The second operational amplification unit 11b performs a non-canceling operation to generate the output voltage Vob (output voltage Vout of operational amplifier 10) when the inverted control signal SCX has a second level (e.g., H level).

The inverted control signal SCX is generated by inverting the logic of the control signal SC. Therefore, if the control signal SC has an H level, the inverted control signal SCX is set to an L level, and vice versa. That is, the inverted control signal SCX and the control signal SC are complementary signals. The first operational amplification unit 11a and the second operational amplification unit 11b thus operate complementary to each other. When the first operational amplification unit 11a performs the canceling operation (holding operation and compensation operation), the second operational amplification unit 11b performs the non-canceling operation (generation of output voltage Vout). When the second operational amplification unit 11b performs the canceling operation (holding operation and compensation operation), the first operational amplification unit 11a performs the non-canceling operation (generation of output voltage Vout).

An output terminal of the first operational amplification unit 11a and an output terminal of the second operational amplification unit 11b are connected to a switch SW1, which functions as an output selection circuit. The switch SW1 includes a common terminal, a first switching terminal, and a second switching terminal. The first switching terminal is connected to the output terminal of the first operational amplification unit 11a, and the second switching terminal is connected to the output terminal of the second operational amplification unit 11b. The switch SW1 connects the common terminal to either the first switching terminal or the second switching terminal in response to the control signal SC. In the first embodiment, the switch SW1 connects the common terminal to the second switching terminal when the control signal SC has an L level and connects the common terminal to the first switching terminal when the control signal SC has an H level. Therefore, the common terminal is selectively connected to the output terminal of the first operational amplification unit 11a and the output terminal and of the second operational amplification unit 11b. Consequently, the operational amplifier 10 selects either the output voltage Voa of the first operational amplification unit 11a or the output voltage Vob of the second operational amplification unit 11b as the output voltage Vout. Accordingly, the output voltage Vout is continuously output.

In the above description and FIG. 2, the switch SW1 is a so-called make before break (MBB) switch in which the common terminal connects to both the first and second switching terminals during switching. The MBB switch continuously generates the output voltage Vout even when the connection of the switch SW is being switched.

The configuration of the first operational amplification unit 11a will now be described.

Figure 4:
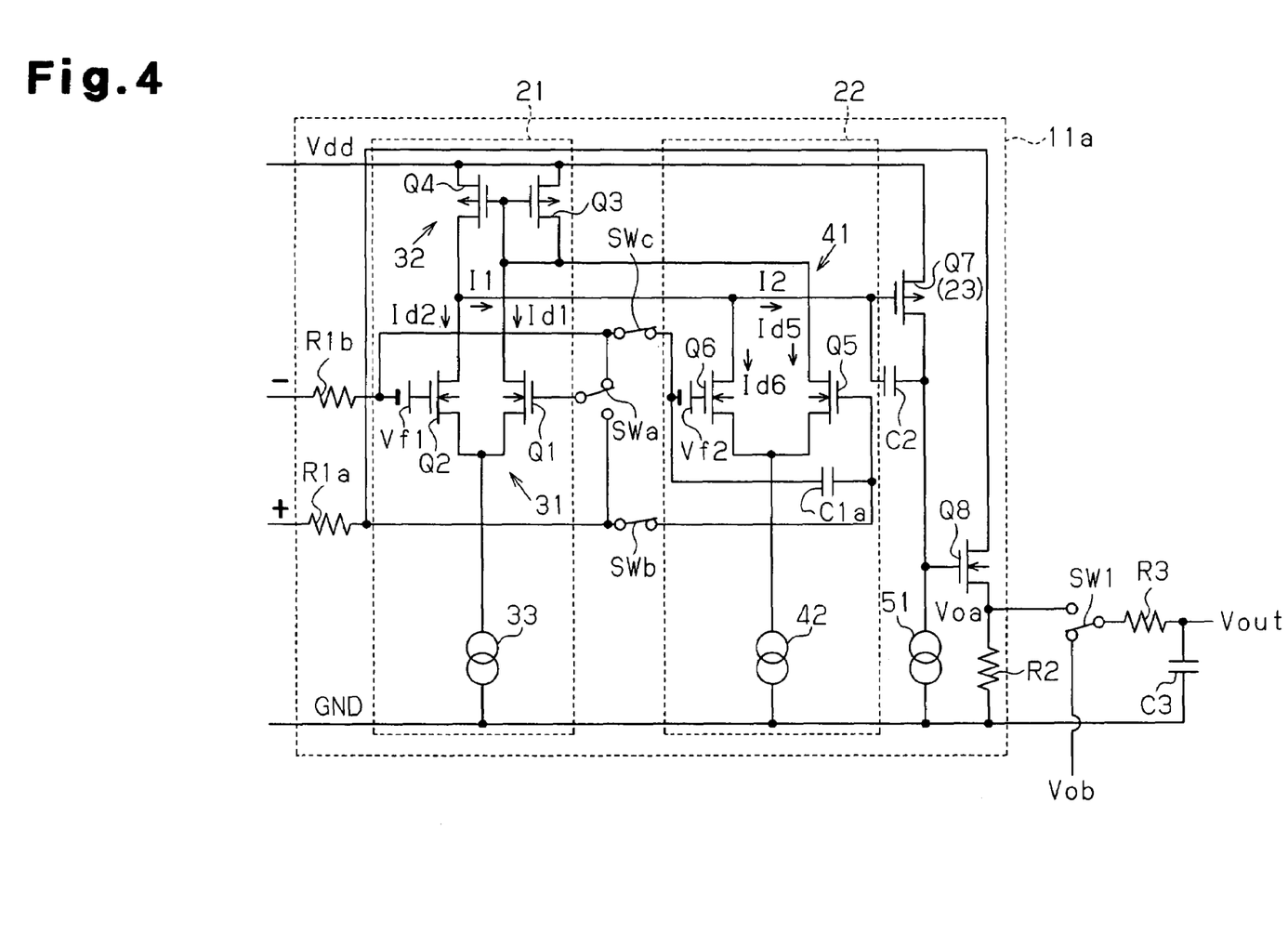
FIG. 4 is a schematic circuit diagram of the first operational amplification unit in the operational amplifier shown in FIG. 2.

As shown in FIG. 4, the first operational amplification unit 11a includes an operational amplification circuit 21, an offset adjustment circuit 22, and an output circuit 23.

The operational amplification circuit 21 includes a first differential input circuit 31, a current mirror circuit 32, and a constant current source 33. The first differential input circuit 31 is formed by two transistors Q1 and Q2. The two transistors Q1 and Q2 are each configured by an N-channel MOS transistor. The sources of the two transistors Q1 and Q2 are connected to each other and to a low potential power supply (e.g., ground GND) via the constant current source 33.

The gate of the first transistor Q1 is connected to a first switch SWa. The first switch SWa includes a common terminal, a first terminal, and a second terminal. The common terminal is connected to the gate of the transistor Q1. The first terminal is connected to the non-inverting input terminal (indicated as "+" in FIG. 4) of the first operational amplification unit 11a via a resistor R1a. The second terminal is connected to the inverting input terminal (indicated as "−" in FIG. 4) of the first operational amplification unit 11a via a resistor R1b. Specifically, the first terminal of the resistor R1a is connected to the first terminal of the first switch SWa, and the second terminal of the resistor R1a is connected to the non-inverting input terminal of the operational amplification unit 11a. Further, the first terminal of the resistor R1b is connected to the second terminal of the first switch SWa, and the second terminal of the resistor R1b is connected to the inverting input terminal of the operational amplification unit 11a. The resistors R1a and R1b have substantially the same resistance in the first embodiment. The first switch SWa is controlled so that the common terminal connects to the second terminal during the holding operation for holding the offset voltage Voff1 of the first operational amplification unit 11a. The first switch SWa is further controlled so that the common terminal connects to the first terminal during the compensation operation for canceling the offset voltage Voff1 of the first operational amplification unit 11a.

The gate of the second transistor Q2 is connected to the first terminal of the resistor R1b via a voltage source Vf1. The voltage source Vf1, which represents the offset voltage in the operational amplification circuit 21, is actually not connected to the gate of the second transistor Q2.

The current mirror circuit 32 is formed by two transistors Q3 and Q4. The two transistors Q3 and Q4 are each configured by a P-channel MOS transistor. The drains of the two transistors Q3 and Q4 are respectively connected to the drains of the transistors Q1 and Q2. The sources of the two transistors Q3 and Q4 are connected to a high potential power supply Vdd. The gates of the transistors Q3 and Q4 are connected to each other. The gate of the transistor Q3 is also connected to the drain of the transistor Q3. Further, the drains of transistors Q3 and Q4 are connected to the offset adjustment circuit 22.

The offset adjustment circuit 22 includes a second differential input circuit 41 and a constant current source 42. The second differential input circuit 41 and the constant current source 42 are connected in parallel to the first differential input circuit 31 and the constant current source 33 of the operational amplification circuit 21. Specifically, the second differential input circuit 41 is formed by two transistors Q5 and Q6. The two transistors Q5 and Q6 are each configured by an N-channel MOS transistor. The sources of the two transistors Q5 and Q6 are connected to each other and to a low potential power supply (e.g., ground GND) via the constant current source 42. The gate of the fifth transistor Q5 is connected to the non-inverting input terminal of the first operational amplification unit 11a via a second switch SWb and the resistor R1a. The gate of the sixth transistor Q6 is connected to the inverting input terminal of the first operational amplification unit 11a via a voltage source Vf2, a third switch SWc, and the resistor R1b. The voltage source Vf2, which represents the offset voltage in the offset adjustment circuit 22, is actually not connected to the gate of the sixth transistor Q6. The voltage source Vf2 has substantially the same voltage value as the voltage source Vf1.

The drains of the two transistors Q5 and Q6 are connected to the current mirror circuit 32. Specifically, the drain of the transistor Q5 is connected to the drain of the transistor Q3, and the drain of the transistor Q6 is connected to the drain of the transistor Q4. The capacitor C1a, which functions as a holding means, is connected between the gate of the fifth transistor Q5 and the gate of the sixth transistor Q6. Specifically, the first terminal of the capacitor C1a is connected to a node between the gate of the fifth transistor Q5 and the second switch SWb, and the second terminal of the capacitor C1a is connected to a node between the voltage source Vf2 (actually, the gate of sixth transistor Q6) and the third switch SWc.

The second switch SWb and the third switch SWc are each activated during the holding operation for holding the offset voltage Voff1 of the first operational amplification unit 11a with the capacitor C1a. Further, the second switch SWb and the third switch SWc are each inactivated during the compensation operation for canceling the offset voltage Voff1 of the first operational amplification unit 11a.

A node between the fourth transistor Q4 and the second transistor Q2 is connected to the gate of the transistor Q7, which forms the output circuit 23. The transistor Q7, which is configured by a P-channel MOS transistor, includes a source connected to the high potential power supply Vdd and a drain connected to the low potential power supply (e.g., ground GND) via a constant current source 51. A capacitor C2, which prevents oscillation, is connected between the gate and drain of the transistor Q7.

The gate of a transistor Q8, which forms a feedback resistor, is connected to a node between the transistor Q7 and the constant current source 51. The transistor Q8, which is configured by an N-channel MOS transistor, includes a source connected to the low potential power supply (e.g., ground GND) via a resistor R2 and a drain connected to the first terminal of the resistor R1a.

A node between the transistor Q8 and the resistor R2 functions as an output terminal of the first operational amplification unit 11a. The output terminal is connected to a load resistor R3 (not shown in FIG. 2) and to a capacitor C3 (not shown in FIG. 2), which holds an output, via the switch SW1.

The operation of the first operational amplification unit 11a will now be discussed.

[Holding Operation for Holding Offset Voltage]

The common terminal of the first switch SWa is connected to the second terminal. This short-circuits the gates of the first transistor Q1 and second transistor Q2, that is, the input terminals of the operational amplification circuit 21 are short-circuited. The second switch SWb is activated, and the gate of the fifth transistor Q5, that is, the first terminal of the capacitor C1a, is connected to the first terminal of the resistor R1a via the second switch SWb. Further, the third switch SWc is activated, and the gate of the sixth transistor Q6, that is, the second terminal of the capacitor C1a, is connected to the first terminal of the resistor R1b.

When the switches SWa to SWc are connected as described above, the gate voltage of the second transistor Q2 becomes greater than the gate voltage of the first transistor Q1 by the offset voltage by the voltage source Vf1. The current I1 that flows between the operational amplification circuit 21 and the output circuit 23 is expressed by the following equation of the difference between the current Id1 that flows to the first transistor Q1 and the current Id2 that flows to the second transistor Q2.

$$I1 = Id1 - Id2$$

The gate of the first transistor Q1 and the gate of the second transistor Q2 are short-circuited via the first switch SWa. Therefore, the current I1 is expressed by the following equation of the product of a mutual conductance gm1 of the operational amplification circuit 21 and the voltage source Vf1 (offset voltage in the operational amplification circuit 21).

$$I1 = gm1 \times Vf1 = Id1 - Id2$$

The first terminal of the resistor R1a is connected to the output terminal of the first operational amplification unit 11a via the transistor Q8. Thus, a potential difference is created between the first terminals of the resistors R1a and R1b due to the offset voltage (voltage source Vf1). If the potential difference is V2, the gate voltage of the sixth transistor Q6 becomes greater than the gate voltage of the fifth transistor Q5 by the sum of the potential difference V2 and the offset voltage Vf2. The current I2 that flows between the offset adjustment circuit 22 and the output circuit 23 is expressed by the following equation of the difference between the current Id5, which flows to the fifth transistor Q5, and the current Id6, which flows to the sixth transistor Q6.

$$I2 = Id5 - Id6$$

Current I2 is expressed by the equation shown below using the mutual conductance gm2 of the offset adjustment circuit 22, the voltage source Vf2 (offset voltage in the offset adjustment circuit 22), and the potential difference V2.

$$I2 = gm2 \times (V2 + Vf2) = Id5 - Id6$$

The operational amplification circuit 21 and the offset adjustment circuit 22 are connected in parallel. Thus, charge is accumulated in the capacitor C1a so that the currents I1 and I2 become the same. That is, charge is accumulated in the capacitor C1a so that the potential difference between the two electrodes becomes equal to the offset voltage at the operational amplification circuit 21 and the offset adjustment circuit 22.

Figure 5:
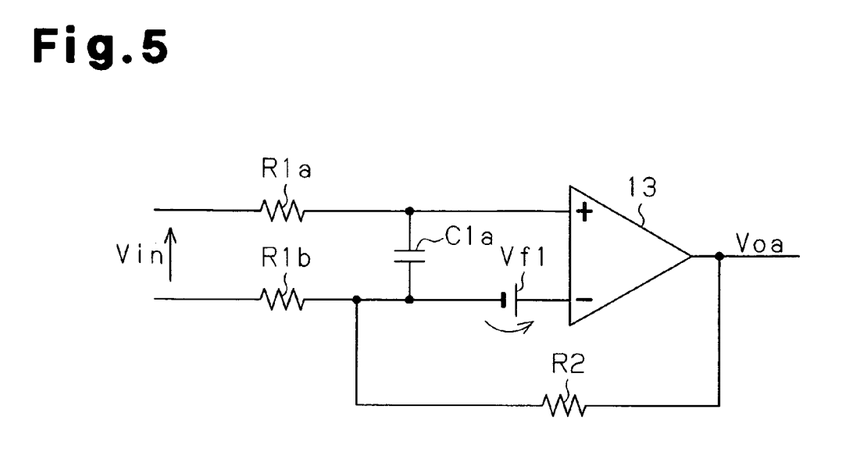
FIG. 5 is a schematic equivalent circuit diagram taken during a holding operation of the first operational amplification unit shown in FIG. 4.

FIG. 5 is an equivalent circuit of the first operational amplification unit 11a during offset adjustment. In the equivalent circuit, an operational amplifier 13 is ideal and does not contain an offset voltage. The voltage source Vf1 produces the offset voltage Voff1 of the first operational amplification unit 11a. In FIG. 5, the output voltage Voa is expressed by the equation shown below when R1a=R1b=R1 is satisfied.

$$Voa = (1 + (R2/R1)) \times (Vin - Vf1)$$

In FIG. 5, the capacitor C1a includes two electrodes. The voltage at the first electrode of the capacitor C1a, which is connected to the non-inverting input terminal, is greater than the voltage at the inverting input terminal by the input voltage Vin. Further, the voltage at the second electrode of the capacitor C1a is obtained by dividing the output voltage Voa of the first operational amplification unit 11a and the voltage at the inverting input terminal with the input resistor R1 (R1a, R1b) and the feedback resistor R2. Thus, the voltage Vc1 at the second electrode of the capacitor C1a is expressed by the equation shown below.

$$Vc1 = (R1/(R1+R2)) \times Voa = Vin - Vf1$$

As described above, the voltage at the first electrode of the capacitor C1a is greater than the voltage at the inverting input terminal by the input voltage Vin. Therefore, the potential difference between the electrodes of the capacitor C1a becomes equal to the offset voltage (voltage source Vf1). That is, the capacitor C1a is charged to become equal to the offset voltage (voltage source Vf1) of the first operational amplification unit 11a.

[Compensation Operation for Canceling Offset Voltage]

When the first operational amplification unit 11a shown in FIG. 4 performs the compensation operation, that is, when the offset voltage Voff1 of the first operational amplification unit 11a is canceled by the offset adjustment circuit 22, the gate of the first transistor Q1 is connected to the non-inverting input terminal via the resistor R1a by the first switch SWa. Further, the second switch SWb and the third switch SWc are both inactivated.

Figure 6:
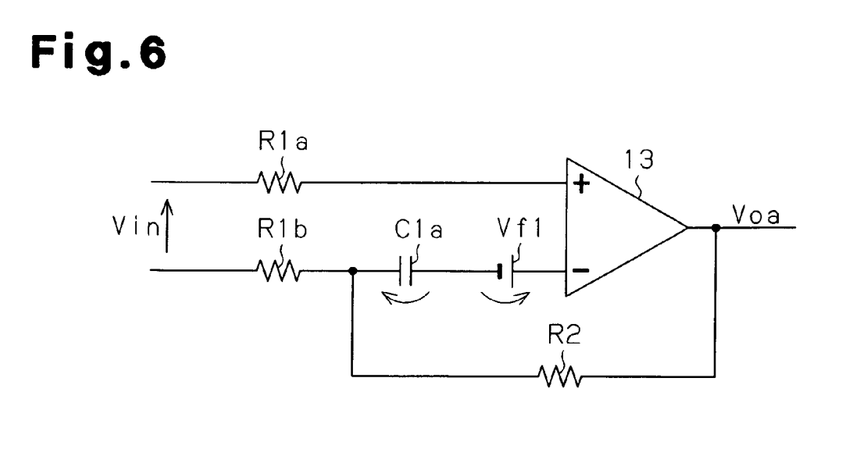
FIG. 6 is a schematic equivalent circuit diagram taken during a compensation operation of the first operational amplification unit shown in FIG. 4.

As a result, the first operational amplification unit 11a shown in FIG. 4 becomes as shown by the equivalent circuit of FIG. 6. In the equivalent circuit, the capacitor C1a is connected in series to the voltage source Vf1. Charge having a potential difference in the reverse direction of the voltage of the voltage source Vf1 (i.e., offset voltage) is accumulated in the capacitor C1a. Therefore, the offset voltage Voff1 of the first operational amplification unit 11a is canceled by the potential difference produced by the charge accumulated in the capacitor C1a, and the input voltage Vin is supplied to the operational amplifier 13.

Figure 3:
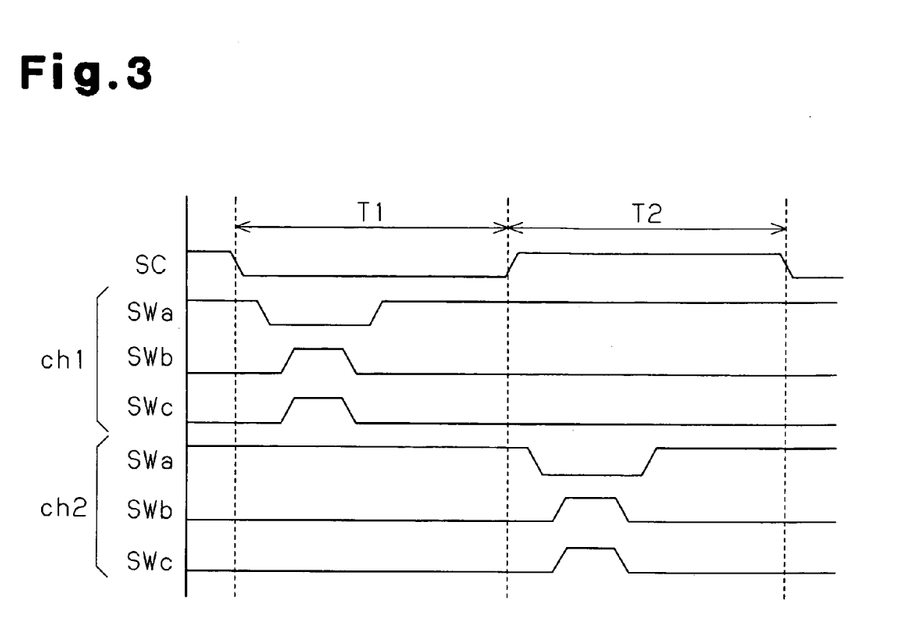
FIG. 3 is a control waveform chart of first and second operational amplification units in the operational amplifier shown in FIG. 2.

The operational amplifier 10 of the first embodiment includes the first operational amplification unit 11a, which functions as channel 1 (ch1), and the second operational amplification unit 11b, which functions as channel 2 (ch2). As shown in FIG. 3, channels ch1 and ch2 operate alternately. The second operational amplification unit 11b has the same configuration as the first operational amplification unit 11a and thus will not be described.

In Fig. 3, the first switch SWa connects the gates of the first transistor Q1 and the second transistor Q2 shown in FIG. 4 when a SWa switching control signal has an L level. Further, the first switch SWa disconnects the gates of the first transistor Q1 and the second transistor Q2 when the SWa switching control signal has an H level. The second switch SWb and the third switch SWc are both inactivated when a SWb switching control signal has an L level and a SWc switching control signal has an L level. Further, the second switch SWb and the third switch SWc are both activated when the SWb switching control signal has an H level and the SWc switching control signal has an H level. The SWa switching control signal, the SWb switching control signal, and the SWc switching control signal are each generated based on the control signal SC.

In FIG. 3, the first operational amplification unit 11a (ch1) performs the canceling operation and the second operational amplification unit 11b (ch2) performs the non-canceling operation during a first period T1 in which the control signal SC is set to an L level. The output voltage Vob generated by amplifying the input voltage Vin with ch2 is selected as the output voltage Vout of the operational amplifier 10. Simultaneously, switching is controlled for each switch SWa to SWc during the first period T1. Therefore, ch1 sequentially performs the holding operation for amplifying its offset voltage Voff1 and accumulating charge, which corresponds to the amplified voltage, in the capacitor C1a and the compensation operation for canceling the offset voltage Voff1 with the charge accumulated in the capacitor C1a during the holding operation. In this state, ch2 generates the output voltage Vob that does not contain offset. The output voltage Vob is selected by the switch Sw1 and output from the operational amplifier 10.

Then, during a second period T2 in which the control signal SC having an H level is provided, ch1 performs the non-canceling operation, and the output voltage Voa generated by amplifying the input voltage Vin with ch1 is selected as the output voltage Vout of the operational amplifier 10. In the meanwhile, ch2 performs the canceling operation.

Therefore, ch1 and ch2 alternately repeat the canceling operation and the non-canceling operation in a complementary manner in accordance with the control signal SC. That is, when one of the operational amplification circuits performs the canceling operation, the other one of the operational amplification circuit performs the non-canceling operation and generates the output voltage Vout (output voltage Voa or output voltage Vob). The operational amplifier 10 thus continuously generates the output voltage Vout that does not contain an offset.

As shown in FIG. 3, the switching from the canceling operation to the non-canceling operation is performed after a predetermined time elapses from when the first SWa switches the holding operation to the compensation operation during the canceling operation. The predetermined time is set to wait until the output voltage Vout (Voa or Vob) reaches the desirable voltage after the operation of each channel is changed to the compensation operation. That is, in the channel performing the holding operation, the input terminals of the operational amplification circuit 21 shown in FIG. 4 are short-circuited, and the output voltage of the channel has a value obtained by amplifying the offset voltage. Therefore, after the operation state is switched from the holding operation to the compensation operation, the output voltage of the channel does not immediately reach the desired voltage. Thus, the output voltage Vout would not be continuous if it were switched to the non-canceling operation immediately after switching the operation of the channel to the compensation operation.

The operational amplifier 10 of the first embodiment has the advantages described below.

(1) The operational amplifier 10 includes a first operational amplification unit 11a and a second operational amplification unit 11b having substantially the same electrical characteristic. One of the operational amplification units (channels) performs a canceling operation (holding operation and compensation operation) on the offset voltage while the other one of the operational amplification units performs the non-canceling operation and generates the output voltage Vout (Voa or Vob). Both operational amplification units 11a and 11b alternately perform the canceling operation and the non-canceling operation. Consequently, the offset voltages Voff1 and Voff2 of the operational amplification units 11a and 11b are cancelled and the output voltage Vout is continuously generated.

(2) The gates of the two transistors Q1 and Q2, which form the differential input circuit 31 of the operational amplification circuit 21, are short-circuited by the first switch SWa. Thus, the offset voltage Voff1 contained in the output voltage (i.e., output voltage of the operational amplification unit 11a) of the operational amplification circuit 21 is held by the capacitor C1a connected between the gates of two transistors Q5 and Q6, which form the differential input circuit 41 of the offset adjustment circuit 22. The potential difference based on the held offset voltage Voff1 is produced between the gates of the two transistors Q5 and Q6. As a result, voltage having a potential difference in the reverse direction of the offset voltage Voff1 is held by the capacitor C1a. The offset voltage is canceled irrespective of the gain of the operational amplifier 10. Thus, the operational amplifier 10 may be set to have any gain.

(3) The first operational amplification unit 11a and the second operational amplification unit 11b alternately perform the non-canceling operation. Thus, the capacitance of the capacitor C3, which holds the output and is arranged in the operational amplification units 11a and 11b, may be reduced. Alternatively, the capacitor C3 may be omitted. Thus, the area occupied by the capacitor C3 may be minimized and the area of the operational amplifier 10 does not have to be increased. This consequently reduces cost of the operational amplifier 10.

(4) The capacitor C1 of the operational amplification unit 11a is separated from the inverting input terminal and the non-inverting input terminal by the second switch SW2 and the third switch SW3 in the compensation operation. Thus, the gate voltages of the fifth transistor Q5 and the sixth transistor Q6 forming the offset adjustment circuit 22 are not affected by the input voltage Vin. This prevents the input voltage Vin from fluctuating the gate voltages of the fifth transistor Q5 and the sixth transistor Q6.

An operational amplifier 60 according to a second embodiment of the present invention will now be described with reference to FIG. 7.

Figure 7:
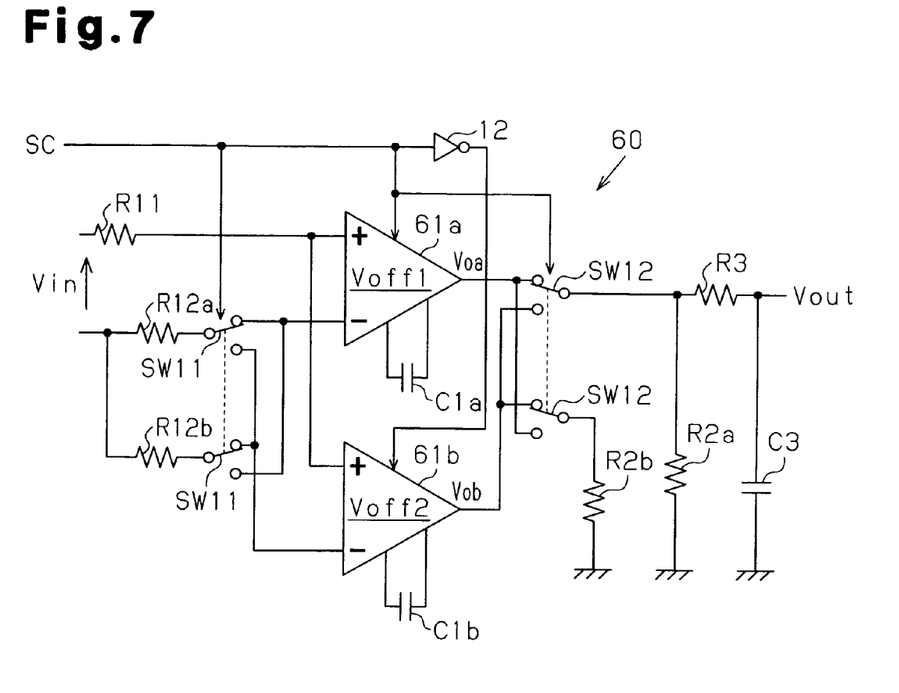
FIG. 7 is a schematic circuit diagram of an operational amplifier according to a second embodiment of the present invention.

As shown in FIG. 7, the operational amplifier 60 includes first and second operational amplification units 61a and 61b. The first operational amplification unit 61a and the second operational amplification unit 61b are configured by the same circuit elements as the operational amplification units 11a and 11b of the first embodiment shown in FIG. 2 except for the resistors R1a, R1b, R2 (see FIG. 4).

The first operational amplification unit 61a and the second operational amplification unit 61b are connected in parallel to the input voltage Vin. Specifically, the non-inverting input terminal of the first operational amplification unit 61a is connected to the first terminal of the resistor R11. The inverting input terminal of the first operational amplification unit 61a is connected to the first terminal of each of resistors R12a and R12b via a first switch SW11, which functions as an input selection circuit. The second terminals of the resistors R12a and R12b are short-circuited with each other, and the input voltage Vin is supplied between the second terminal of the resistor R11 and the second terminals of the two resistors R12a and R12b. The first switch SW11 switches the input resistor that is connected to the inverting input terminals of the first and second operational amplification units 61a and 61b between the resistor R12a and the resistor R12b in a complementary manner based on the control signal SC. Specifically, the first switch SW11 connects the resistor R12a to the first operational amplification unit 61a and the resistor R12b to the second operational amplification unit 61b when the control signal SC has an H level. The first switch SW11 connects the resistor R12a to the second operational amplification unit 61b and the resistor R12b to the first operational amplification unit 61a when the control signal SC has an L level.

The capacitor C1a is connected to the first operational amplification unit 61a to hold the offset voltage Voff1 of to the operational amplification unit 61a. The capacitor C1b is connected to the second operational amplification unit 61b to hold the offset voltage Voff2 of the operational amplification unit 61b.

The output terminals of the first and second operational amplification units 61a and 61b are connected to a second switch SW12, which functions as an output selection circuit. Feedback resistors R2a and R2b are connected to the second switch SW12. In the same manner as the first switch SW11, the second switch SW12 switches the feedback resistor that is connected to the output terminal of each of the first and second operational amplification units 61a and 61b between the resistor R2a and the resistor R2b based on the control signal SC. Specifically, the second switch SW12 connects the first operational amplification unit 61a to a resistor R2a and the second operational amplification unit 61b to a resistor R2b when the control signal SC has an H level. The second switch SW12 connects the first operational amplification unit 61a to the resistor R2b and the second operational amplification unit 61b to the resistor R2a when the control signal SC has an L level.

In the same manner as the switch SW1 in the first embodiment, the first switch SW11 and the second switch SW12 are both make before break (MBB) switches.

A node between the second switch SW12 and the resistor R2a is connected to ground via the resistor R3 and the capacitor C3. The output voltage Vout is output from a node between the resistor R3 and the capacitor C3.

In the operational amplifier 60, the first operational amplification unit 61a and the second operational amplification unit 61b each perform the holding operation for holding charge corresponding to each of the offset voltages Voff1 and Voff2 with the associated capacitors C1a and C1b. Further, the first operational amplification unit 61a and the second operational amplification unit 61b each perform a compensation operation for canceling the offset voltages Voff1 and Voff2 of each operational amplification unit 61a and 61b with the charge held by the associated capacitors C1a and C1b. In the same manner as the first embodiment, the first operational amplification unit 61a and the second operational amplification unit 61b alternately perform the canceling operation, which includes the holding operation and the compensation operation, and the non-canceling operation, which generates the output voltage (Voa or Vob) by amplifying the input voltage Vin in response to the control signal SC.

The first operational amplification unit 61a and the second operational amplification unit 61b use the same input resistor and feedback resistor during the canceling operation and the non-canceling operation. More specifically, the inverting input terminals of the first operational amplification unit 61a and the second operational amplification unit 61b are connected to the resistor R12b during the canceling operation and to the resistor R12a during the non-canceling operation. In the same manner, the output terminals of the first operational amplification unit 61a and the second operational amplification unit 61b are connected to the resistor R2b during the canceling operation and to the resistor R2a during the non-canceling operation.

The first operational amplification unit 61a and the second operational amplification unit 61b respectively generate the output voltages Voa and Vob of substantially the same voltage by amplifying the input voltage Vin by an gain, which is determined by the resistances of the resistors R11, R12a, and R2a, during the non-canceling operation. That is, the gain of the first operational amplification unit 61a and the second operational amplification unit 61b are set to be substantially the same.

In the non-canceling operation, if the resistors connected to both of the first operational amplification unit 61a and the second operational amplification unit 61b have different resistances, the resistances must be equalized. Therefore, highly accurate resistors become necessary. This is because different gains of the operational amplification units 61a and 61b differ the output voltages Voa and Vob and cause the output voltage Vout to become non-continuous.

Comparatively, in the second embodiment, the first operational amplification unit 61a and the second operational amplification unit 61b each have the same resistance during the non-canceling operation. Thus, the first and second operational amplification units 61a and 61b generate the output voltages Voa and Vob having substantially the same voltage values. Consequently, the output voltage Vout is continuously generated without using a highly accurate resistor. This lowers the cost of the resistors and lowers the cost of the operational amplifier.

In the canceling operation, the inverting input terminals of the operational amplification units 61a and 61b are connected to the resistor R12b by the first switch SW11, and the output terminals of the operational amplification units 61a and 61b are connected to the resistor R2b by the second switch SW12. The operational amplification units 61a and 61b do not generate the output voltage during the canceling operation. Thus, the resistors R12b and R2b do not have to be highly accurate. Thus, the resistors R12b, R2b may be reduced in size compared with the resistors R12a and R2a. This-suppresses increase in the area of the operational amplifier 60.

In addition to the advantages of the first embodiment, the operational amplifier 60 of the second embodiment has the advantages described below.

The operational amplifier 60 includes a first operational amplification unit 61a and a second operational amplification unit 61b having substantially the same electrical characteristic. The resistors (input resistor, feedback resistor) connected to the two operational amplification units 61a and 61b are commonly used for the canceling operation and the non-canceling operation. Consequently, the gains of the first operational amplification unit 61a and the second operational amplification unit 61b are set to be substantially same. Therefore, the output voltage Vout is continuously generated without using a resistor controlled to have a highly accurate resistance.

It should be apparent to those skilled in the art that the present invention may be embodied in many other specific forms without departing from the spirit or scope of the invention. Particularly, it should be understood that the present invention may be embodied in the following forms.

In the first and second embodiments, each switch SW1 and SW2 may be a so-called break before make (BBM) switch in which a common terminal is not connect to the first and second switching terminal when a connection is switched. This is because the first operational amplification unit 11a and the second operational amplification unit 11b (or 61a and 61b) generate the output voltages Voa and Vob at substantially the same level, and the output voltage Vout is held by the voltage holding capacitor C3 during the short period in which the switches SW1 and SW2 are switched. Thus, the output voltage Vout is continuously generated even if the BBM switch is used.

In the first and second embodiments, the operational amplifiers 10 and 60 is not limited to the two operational amplification units 11a and 11b (the operational amplification units 61a and 61b in the second embodiment) and may include three or more operational amplification circuits.

In the second embodiment, the first and second operational amplification units 61a and 61b may commonly use only the input resistors R11, R12a, and R12b. Further, the first and second operational amplification units 61a and 61b may commonly use only the feedback resistors R2a and R2b.

The present examples and embodiments are to be considered as illustrative and not restrictive, and the invention is not to be limited to the details given herein, but may be modified within the scope and equivalence of the appended claims.

What is claimed is:

1. An operational amplifier for generating an output voltage by amplifying an input voltage, the operational amplifier comprising;
    a first capacitor;
    a first operational amplification unit connected to the first capacitor and having a first offset voltage, the first operational amplification unit accumulating charge corresponding to the first offset voltage in the first capacitor and alternately performing a canceling operation, for canceling the first offset voltage with the charge accumulated in the first capacitor, and a non-canceling operation, for generating a first output voltage by amplifying the input voltage;
    a second capacitor;
    a second operational amplification unit connected to the second capacitor, having substantially the same electrical characteristic as the first operational amplification unit, and having a second offset voltage, the second operational amplification unit accumulating charge corresponding to the second offset voltage in the second capacitor and alternately performing a canceling operation, for canceling the second offset voltage with the charge accumulated in the second capacitor, and a non-canceling operation, for generating a second output voltage by amplifying the input voltage; and
    an output selection circuit, connected to the first and second operational amplification units, for alternately selecting the first output voltage and the second output voltage as the output voltage of the operational amplifier;
    wherein the second operational amplification unit performs the non-canceling operation when the first operational amplification unit is performing the canceling operation, and the second operational amplification unit performs the canceling operation when the first operational amplification unit is performing the non-canceling operation.

2. The operational amplifier according to claim 1, wherein the first and second operational amplification units each have substantially the same gain.

3. The operational amplifier according to claim 1, further comprising:
    a first feedback resistor, selectively connected to output terminals of the first and second operational amplification units via the output selection circuit, for use as a feedback resistor when the first and second operational amplification units each perform the canceling operation; and
    a second feedback resistor, selectively connected to the output terminals of the first and second operational amplification units via the output selection circuit, for use as a feedback resistor when the first and second operational amplification units each perform the non-canceling operation.

4. The operational amplifier according to claim 3, wherein the first feedback resistor is smaller in size than the second feedback resistor.

5. The operational amplifier according to claim 1, further comprising:
    a first input resistor for receiving the input voltage;
    a second input resistor for receiving the input voltage; and
    an input selection circuit, connected to the first input resistor, the second input resistor, and the first and second operational amplification units, for selectively connecting the first input resistor to input terminals of the first and second operational amplification units during the canceling operation and for selectively connecting the second input resistor to the input terminals of the first and second operational amplification units during the non-canceling operation.

6. The operational amplifier according to claim 5, wherein the first input resistor is smaller in size than the second input resistor.

7. The operational amplifier according to claim 5, wherein the first and second operational amplification units, the output selection circuit, and the input selection circuit operate in accordance with a control signal.

8. The operational amplifier according to claim 1, wherein the first and second operational amplification units are each switched from the canceling operation to the non-canceling operation after a predetermined time elapses from when the canceling operation starts to cancel the corresponding offset voltage.

9. The operational amplifier according to claim 1, wherein the first and second operational amplification units each include:
    a first differential input circuit having first and second input terminals for receiving the input voltage, and the first differential input circuit including a first transistor connected to the first input terminal and a second transistor connected to the second input terminal;
    a current mirror circuit including a third transistor connected to the first transistor and a fourth transistor connected to the second transistor;
    a second differential input circuit connected in parallel to the first differential input circuit and including a fifth transistor connected to the third transistor and a sixth transistor connected to the fourth transistor;
    a first switch, connected to gates of the first and second transistors, for selectively connecting the gates of the first and second transistors;

a second switch, connected to a gate of the fifth transistor and to the first input terminal, for selectively connecting the gate of the fifth transistor and the first input terminal; and a third switch, connected to a gate of the sixth transistor and to the second input terminal, for selectively connecting the gate of the sixth transistor and the second input terminal;

wherein the first and second capacitors are each connected between the gates of the fifth and sixth transistors in each of the first and second operational amplification units.

10. The operational amplifier according to claim 1, wherein the output selection circuit includes a make before break switch.

11. The operational amplifier according to claim 1, further comprising:

a capacitor, connected to the output selection circuit, for holding the output voltage;

wherein the output selection circuit includes a break before make switch or a make before break switch.

* * * * *